United States Patent
Fang et al.

(10) Patent No.: US 10,236,939 B1
(45) Date of Patent: Mar. 19, 2019

(54) SHARING SYSTEM OF NEAR-FIELD COMMUNICATION AND HIGH-FREQUENCY WIRELESS CHARGING COILS

(71) Applicant: NEWVASTEK CO., LTD., New Taipei (TW)

(72) Inventors: Ming-Liang Fang, New Taipei (TW); Chih-Hao Chuang, New Taipei (TW)

(73) Assignee: NEWVASTEK CO., LTD., New Taipei (TW)

( * ) Notice: Subject to any disclaimer, the term of this patent is extended or adjusted under 35 U.S.C. 154(b) by 0 days.

(21) Appl. No.: 16/052,574

(22) Filed: Aug. 1, 2018

(51) Int. Cl.
   *H04B 5/00* (2006.01)
   *H02J 7/02* (2016.01)
   *H03H 7/01* (2006.01)
   *H02J 50/12* (2016.01)

(52) U.S. Cl.
   CPC ............ *H04B 5/0031* (2013.01); *H02J 7/025* (2013.01); *H02J 50/12* (2016.02); *H03H 7/0115* (2013.01); *H04B 5/0075* (2013.01); *H03H 2007/013* (2013.01)

(58) Field of Classification Search
   CPC ... H04B 5/0031; H04B 5/0075; H04W 4/008; H02J 7/025; H02J 50/12
   See application file for complete search history.

(56) References Cited

U.S. PATENT DOCUMENTS

| | | | |
|---|---|---|---|
| 9,647,725 B1 * | 5/2017 | Gay | H04B 5/0037 |
| 2013/0257167 A1 * | 10/2013 | Singh | H02J 50/12 307/104 |
| 2017/0019152 A1 * | 1/2017 | Kim | H04B 5/0031 |

* cited by examiner

*Primary Examiner* — Tuan Pham
(74) *Attorney, Agent, or Firm* — Leong C. Lei

(57) ABSTRACT

The present invention relates to a sharing system of the near-field communication and the high-frequency wireless charging coils. The main structure comprises a wireless signal transmission unit for receiving signals which will then transmit to a first resonance unit and a second resonance unit at both ends, and then the signals will enter a first notch filter module and a second notch filter module and then charge a load element. The near-field communication module connects with the wireless signal transmission unit to receive a signal. Such that, the near-field communication module can share coils with the high-frequency wireless charging coils to achieve the space-saving effect.

7 Claims, 8 Drawing Sheets

SHARING SYSTEM OF NEAR-FIELD COMMUNICATION AND HIGH-FREQUENCY WIRELESS CHARGING COILS

TECHNICAL FIELD OF THE INVENTION

The present invention relates to a sharing system of the near-field communication and the high-frequency wireless charging coils, and especially relates to a sharing system of the
Near-Field Communication (NFC) and the high-frequency wireless charging (Class-E rectifier circuit).

DESCRIPTION OF THE PRIOR ART

Basically, a high-frequency wireless charging rectification circuit and a Near-Field Communication (NFC) can share the coils. But if they are to be used in the high-frequency wireless charging (Class-E rectifier circuit), the Near-Field Communication (NFC) signal is configured as a capacitive input impedance independent of the load RL via a resonance unit in the high-frequency wireless charging (Class-E rectifier circuit).

This capacitive input impedance causes a parallel capacitance effect at the input end of the NFC circuit, therefore the Near-Field Communication (NFC) signal will charge the regulation module; so that the NFC matching is not easily achieved and results that the Near-Field Communication (NFC) circuit cannot detect the Near-Field Communication (NFC) signal.
Therefore, how to make the Near-Field Communication (NFC) share the coil with the high-frequency wireless charging (Class-E rectification circuit) without making the signal become charging the battery is a problem that needs to be solved.

SUMMARY OF THE INVENTION

The main object of the present invention is to use a first notch filter module and a second notch filter module to enable a Near-Field Communication (NFC) module and a high-frequency wireless charging (Class-E rectifier circuit) share coils to achieve the space-saving effects. The main structure of the present invention comprises: a wireless signal transmission unit which both ends respectively has a first resonance unit and a second resonance unit; a first notch filter module connected in series with the first resonance unit and located at one side of the first resonance unit facing away from the wireless signal transmission unit; a second notch filter module connected in series with the second resonance unit and located at one side of the second resonance unit facing away from the wireless signal transmission unit; a first rectifier module connected in series with the first notch filter module; a third resonance unit connected in parallel with the first rectifier module; a second rectifier module connected in series with the second notch filter module; a fourth resonance unit connected in parallel with the second rectifier module; a voltage regulation module respectively connected with the first rectifier module and the second rectifier module; a grounding portion set in one side of the load element; a shunt module set at the output end of the voltage regulation module; and a Near-Field Communication (NFC) module having a first connection end and a second connection end; wherein the first connection end is connected with the first notch filter module and the first resonance unit, and the second connection end is connected with the second notch filter module and the second resonance unit; wherein the first notch filter module comprises a first notch filter resonance unit connected in series with the first resonance unit and a first notch filter impedance unit connected in parallel with the first notch filter resonance unit; wherein the second notch filter module comprises a second notch filter resonance unit connected in series with the second resonance unit and a second notch filter impedance unit connected in parallel with the second notch filter resonance unit; wherein the shunt module comprises a first shunt portion connected with the first notch filter module and the first rectifier module and a second shunt portion connected with the second notch filter module and the second rectifier module.

With the above structure, when the wireless signal transmission unit receives the signal of the Near-Field Communication (NFC) module, an inductive impedance is generated through the first notch filter impedance unit and the second notch filter impedance unit, so that the signal is transmitted to the Near-Field Communication (NFC) module. Therefore, the Near-Field Communication (NFC) module can use the wireless signal transmission unit as a signal transceiver coil, and so as to enhance the ability to resist electromagnetic interference.

If the wireless signal transmission unit receives the alternating current signal and is in the positive half-cycle of the alternating current, the first resonance unit will cooperated with the third resonance unit to do the resonance tuning for the first rectifier module; and the first notch filter resonance unit in the first notch filter module can further enhance the resonance tuning effect. And, the current is reflowed to achieve a doubled efficiency through the first shunt unit and the voltage regulator module is used to stabilize the current and charge the load element.

Similarly, the situation is the same when the alternating current is in the negative half-cycle.

This charging way is a high-frequency wireless charging (Class-E rectifier circuit) way which can share the wireless signal transmission unit with the Near-Field Communication (NFC) module, so as to achieve the effects of space-saving and enhancing the resistance for the electromagnetic interference.

By using the above technology, the present invention can break through the problem that the Near-Field Communication (NFC) module cannot share the coils with the high-frequency wireless charging (Class-E rectifier circuit), and achieve the practical progressiveness with the above advantages.

DETAILED DESCRIPTION OF THE PREFERRED EMBODIMENTS

The following descriptions are exemplary embodiments only, and are not intended to limit the scope, applicability or configuration of the invention in any way. Rather, the following detailed description provides a convenient illustration for implementing exemplary embodiments of the invention. Various changes to the described embodiments may be made in the function and arrangement of the elements described without departing from the scope of the invention as set forth in the appended claims.

The foregoing and other aspects, features, and utilities of the present invention will be best understood from the following detailed description of the preferred embodiments when read in conjunction with the accompanying drawings.

Figure 1:
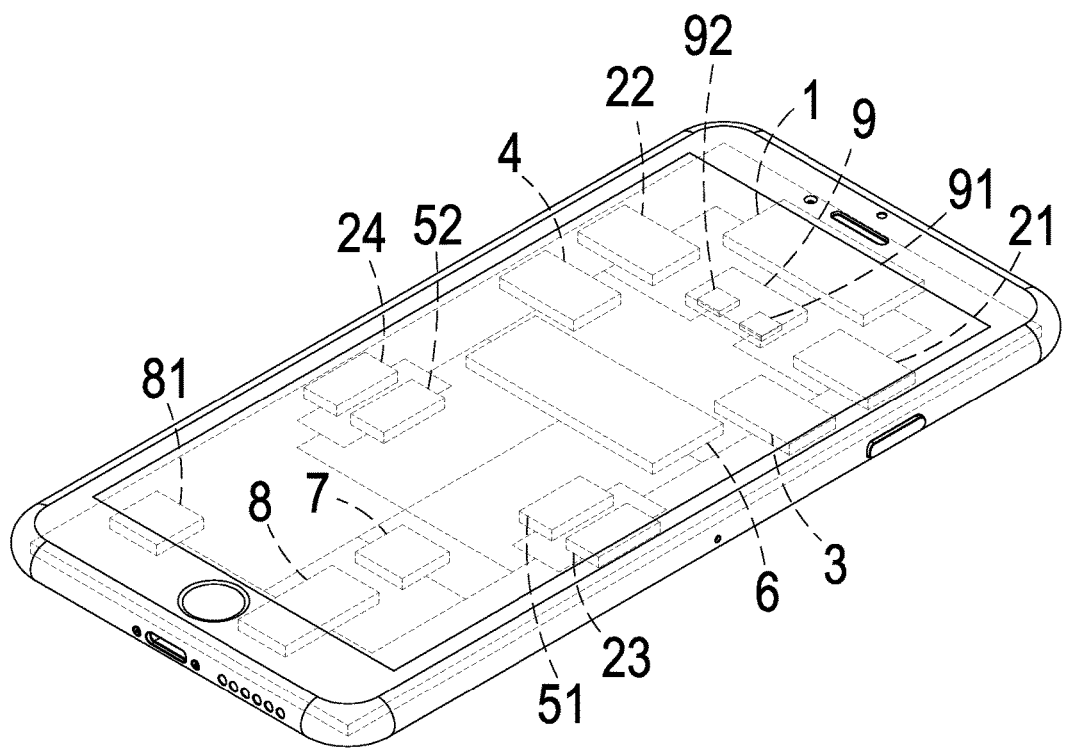
FIG. 1 is a 3-D perspective view of the preferred embodiment according to the present invention.
Figure 2:
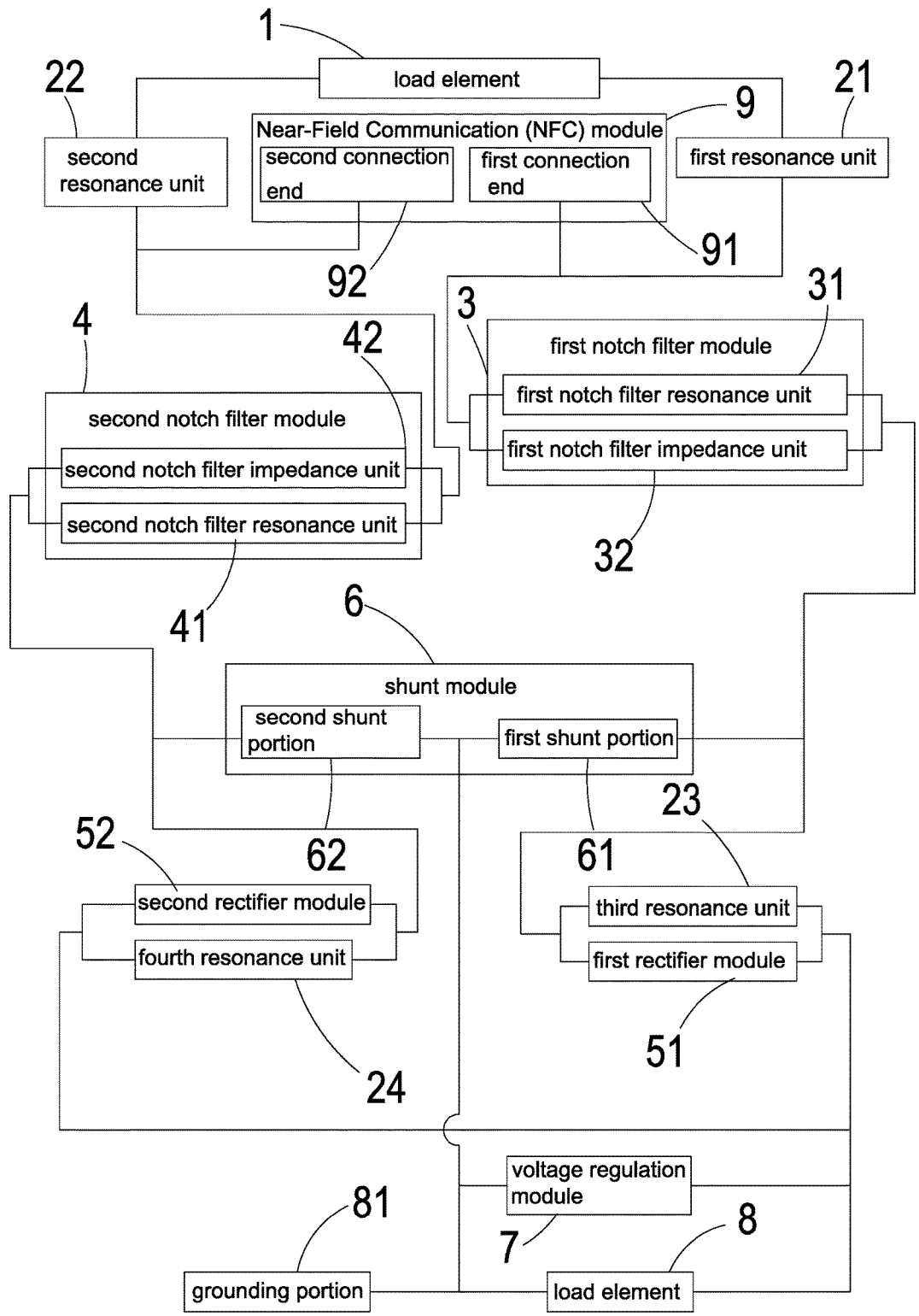
FIG. 2 is a structure block diagram of the preferred embodiment according to the present invention.
Figure 3:
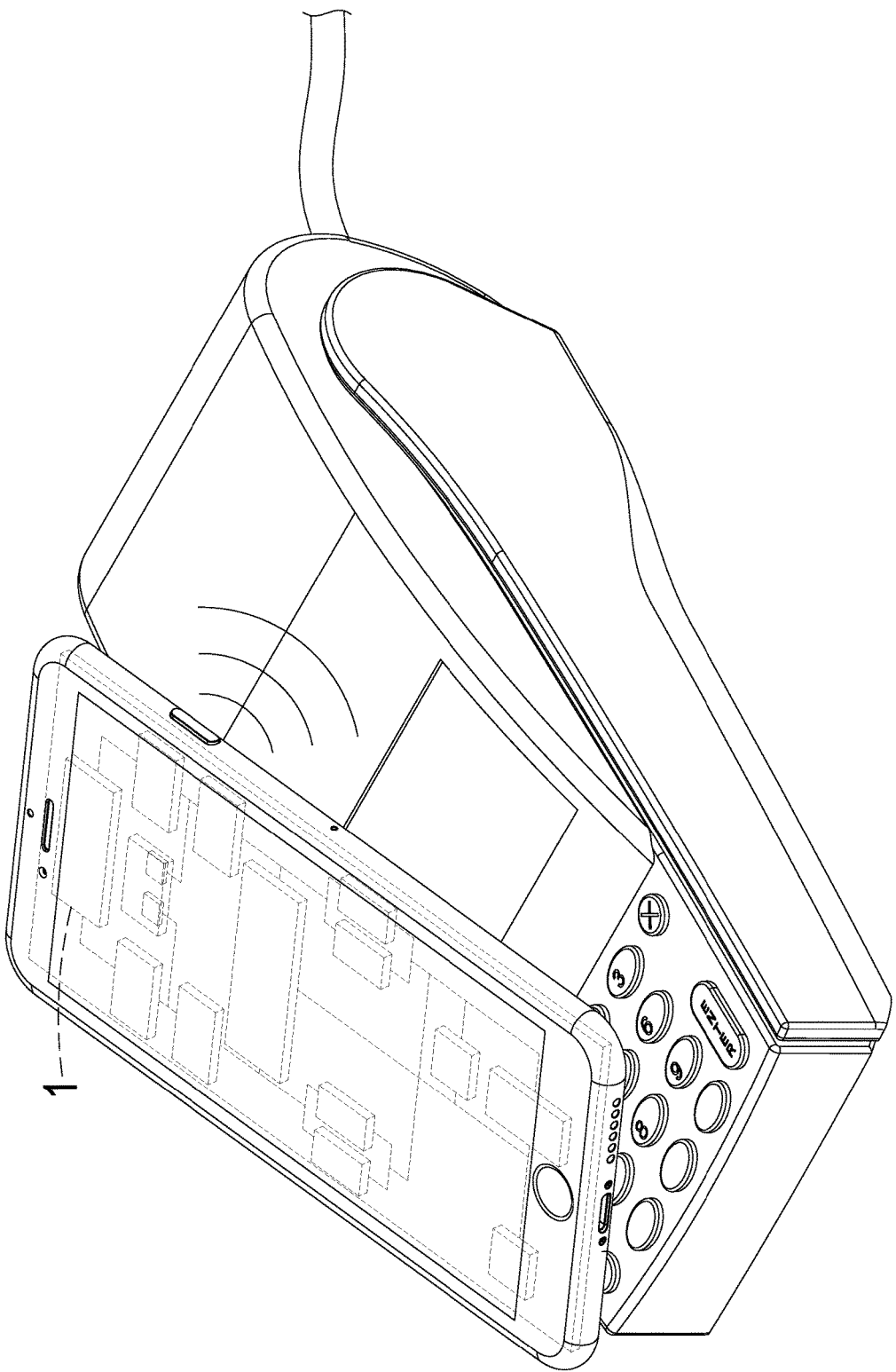
FIG. 3 is a connection schematic diagram of the preferred embodiment according to the present invention.
Figure 4:
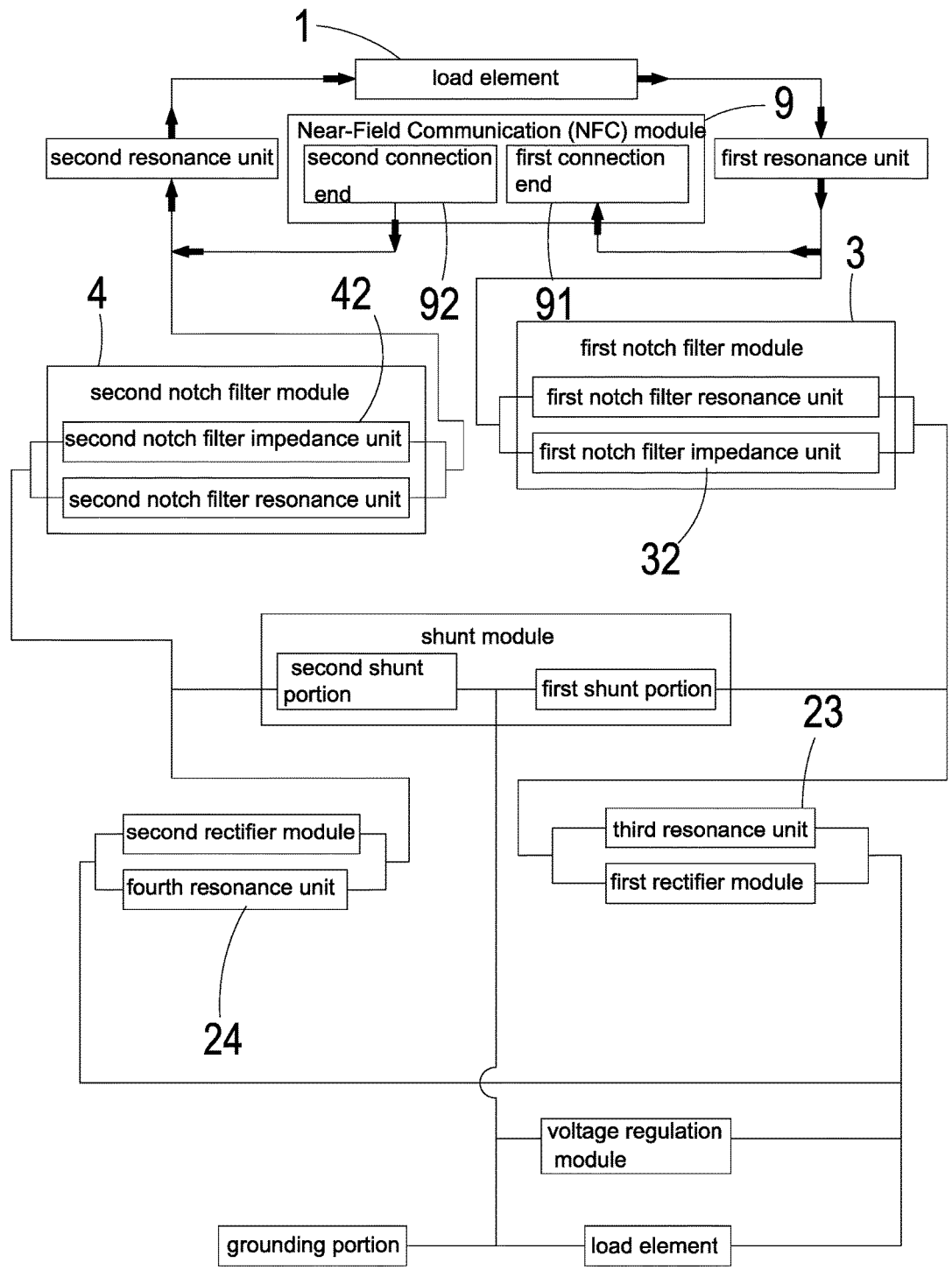
FIG. 4 is a flow-direction schematic diagram of the Near-Field Communication components of the preferred embodiment according to the present invention.
Figure 5:
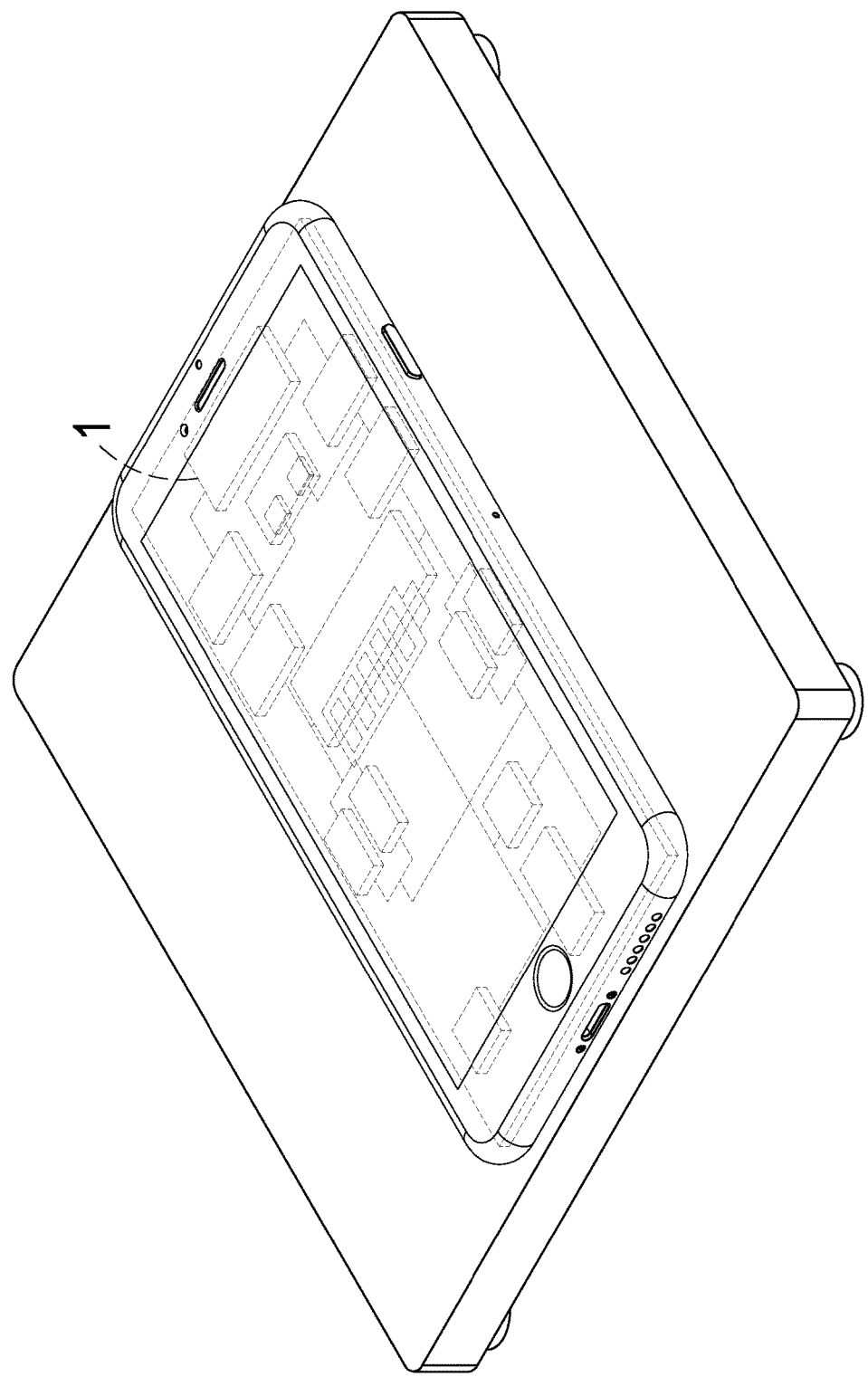
FIG. 5 is a charging schematic diagram of the preferred embodiment according to the present invention
Figure 6:
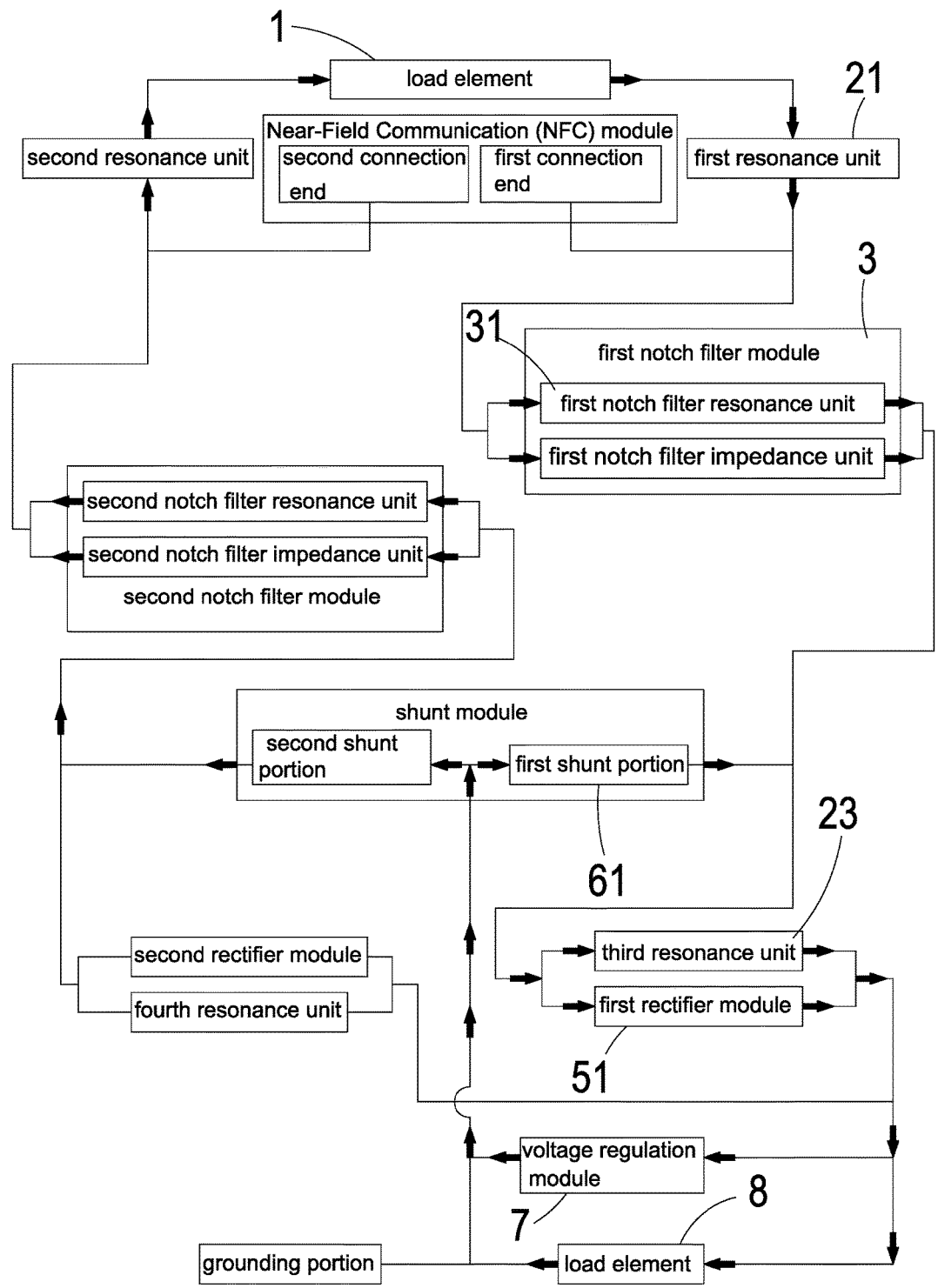
FIG. 6 is a flow-direction schematic diagram in the positive half-cycle of the preferred embodiment according to the present invention.
Figure 7:
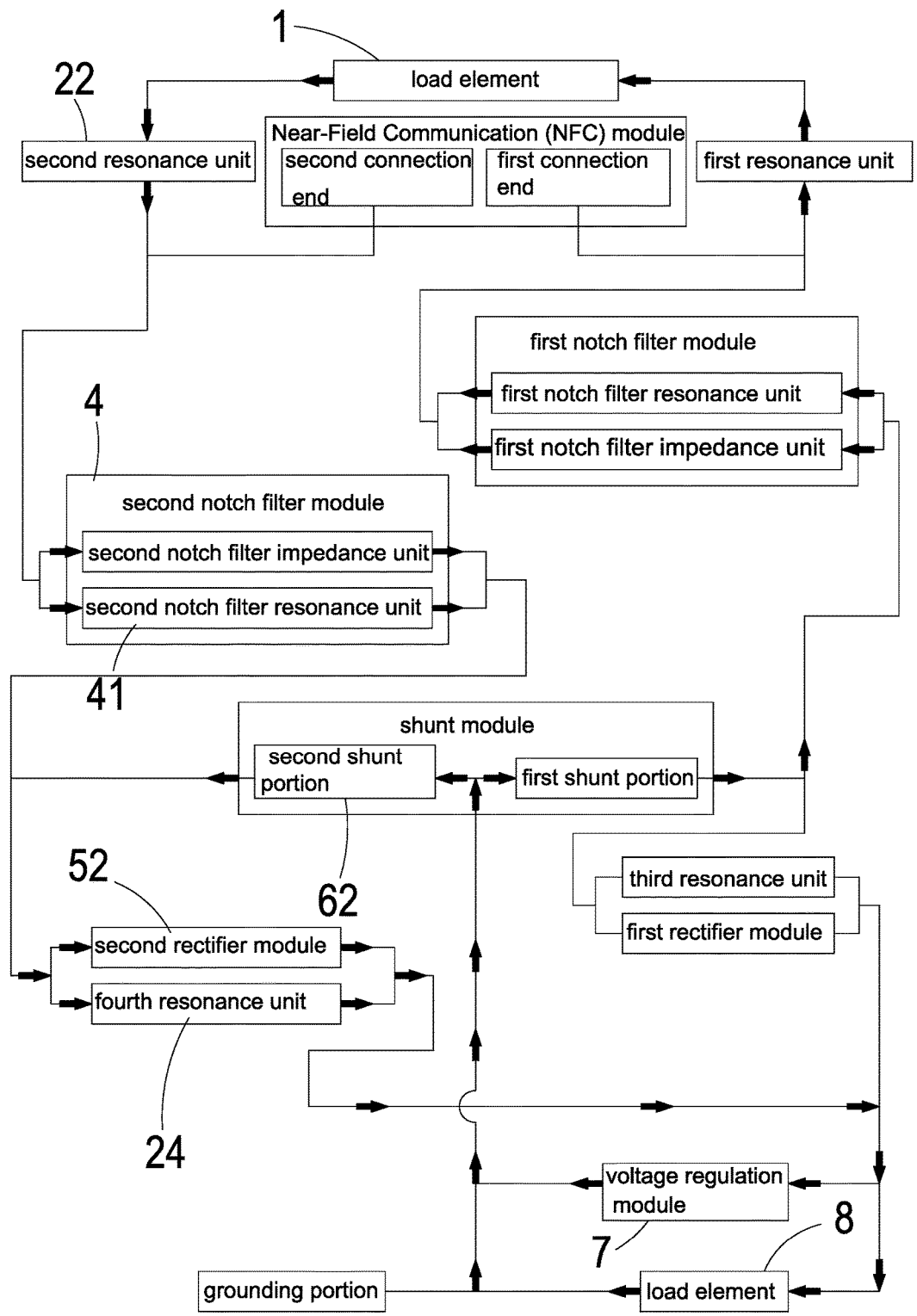
FIG. 7 is a flow-direction schematic diagram in the negative half-cycle of the preferred embodiment according to the present invention.

Please refer FIG. 1 and FIG. 2, it can be clearly seen from the figures that the present invention comprises: a wireless signal transmission unit 1, a first resonance unit 21 and a second resonance unit 22 are respectively connected to both ends of the wireless signal transmission unit 1; a first notch filter module 3 connected in series with the first resonance unit 21 and located at one side of the first resonance unit 21 facing away from the wireless signal transmission unit 1; wherein the first notch filter module 3 comprises a first notch filter resonance unit 31 connected in series with the unit 21 and a first notch filter impedance unit 32 connected in parallel with the first notch filter resonance unit 31; wherein the first notch filter resonance unit 31 is capacitance and the first notch filter impedance unit 32 is inductance; a first rectifier module 51 located at one side of the first notch filter module 3 facing away from the first resonance unit 21 and connected in series with the first notch filter module 3; a third resonance unit 23 connected in parallel with the first rectifier module 51; wherein the third resonance unit 23 is capacitance; a second notch filter module 4 connected in series with the second resonance unit 22 and located at one side of the second resonance unit 22 facing away from the wireless signal transmission unit 1; wherein the second notch filter module 4 comprises a second notch filter resonance unit 41 and a second notch filter impedance unit 42 connected in parallel with the second notch filter resonance unit 41; wherein the second notch filter resonance unit 41 is capacitance and the second notch filter impedance unit 42 is inductance; a second rectifier module 52 located at one side of the second notch filter module 4 facing away from the second resonance unit 22 and connected in series with the second notch filter module 4; a fourth resonance unit 24 connected in parallel with the second rectifier module 52; wherein the fourth resonance unit 24 is capacitance; a voltage regulation module 7 respectively connected with the first rectifier module 51 and the second rectifier module 52; wherein the voltage regulation module 7 comprises at least one voltage stabilizing capacitance; a load element 8 connected in parallel with the voltage regulation module 7; wherein the load element 8 comprises at least one resistance element which is a battery in this embodiment; a grounding portion 81 set in one side of the load element 8; a shunt module 6 set at the output end of the voltage regulation module 7; wherein the shunt module 6 comprises a first shunt portion 61 respectively connected with the first notch filter module 3 and the first rectifier module 51 and a second shunt portion 62 respectively connected with the second notch filter module 4 and the second rectifier module 52; wherein the first shunt portion 61 and the second shunt portion 62 are inductance; and a Near-Field Communication (NFC) module 9 having a first connection end 91 and a second connection end 92; wherein the first connection end 91 is connected with the first notch filter module 3 and the first resonance unit 21, and the second connection end 92 is connected with the second notch filter module 4 and the second resonance unit 22.

Please refer FIG. 1 to FIG. 8, it can be clearly seen from the figures that: If the wireless signal transmission unit 1 receives the Near-Field Communication (NFC) module 9 signal, since the frequency is relatively high (13.56 MHz), the first notch filter impedance unit 32 in the first notch filter module 3 and the second notch filter impedance element 42 in the second notch filter module 4 will generate an inductance of 7 dB or more, so that the signal is transmitted to the Near-Field Communication (NFC) module 9 via the first connection end 91; and the signal is transmitted to the wireless signal transmission unit 1 via the second connection end 92. At this time, the first connection end 91 is the receiving end, and the second connection end 92 is the sending end, but vice versa, it is not limited. As a result, the signal will not be transmitted to the rear, and the Near-Field Communication (NFC) module 9 will not because of the resonance tuning effect of the third resonance unit 23 and the fourth resonance unit 24 to not receive the signal.

If the wireless signal transmission unit 1 receives the alternating current signal and is in the positive half-cycle of the alternating current, since the frequency is relatively low (6.78 MHz), the first notch filter resonance unit 31 in the first notch filter module 3 will do the resonance tuning for the current, and then the current will pass through the resonance tuning of the first resonance unit 21 and the third resonance unit 23 to reduce electromagnetic interference (EMI). Moreover, the third resonance unit 23 can also control the duty cycle of the first rectifier module 51, and then the voltage regulation module 7 can stabilize the given voltage of the load element 8; so that the load element 8 can be charged. The first shunt portion 61 can guide the reflow current into the first rectifying module 51 again to strengthen the current through the first rectifier module 51 to increase the charging efficiency.

If it is in the negative half-cycle of the alternating current is similar, that is, the second notch filter module 4 will change to use the second notch filter resonance unit 41 to do the resonance tuning for the current, and then the current will pass through the resonance tuning of the second resonance unit 22 and the fourth resonance unit 24 to reduce electromagnetic interference (EMI). Moreover, the fourth resonance unit 24 can also control the duty cycle of the second rectifier module 52, and then the voltage regulation module 7 can stabilize the given voltage of the load element 8; so that the load element 8 can be charged. The second shunt portion 62 can guide the reflow current into the second rectifier module 52 again to strengthen the current through the second rectifier module 52 to increase the charging efficiency. The above described charging way is the high-frequency wireless charging (Class-E rectifier circuit) way.

Figure 8:
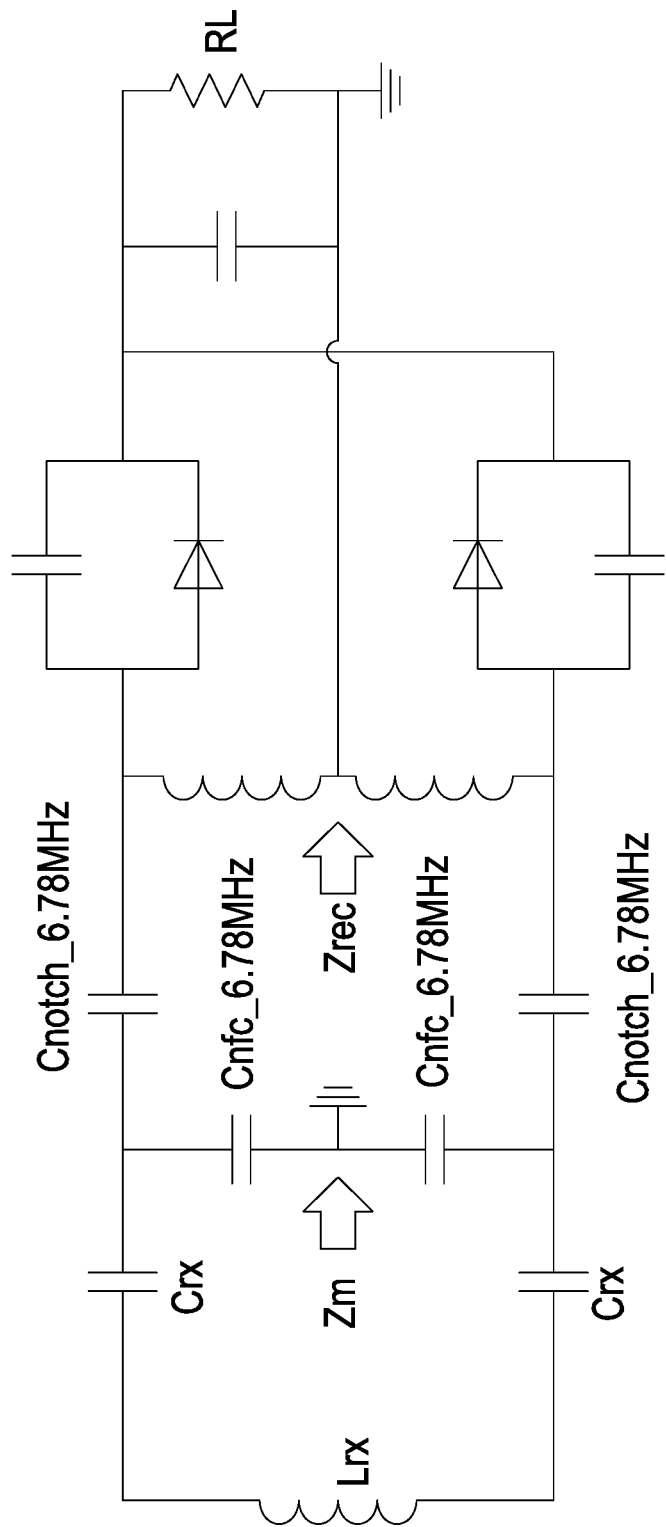
FIG. 8 is an electric circuit schematic diagram of the preferred embodiment according to the present invention.

When using an AC signal, which is a signal with low frequency (6.78 MHz), the following formula cooperated with FIG. 8 can be used to maximize the charging efficiency by using the following formula:

$$R_m = \frac{Z_{rec}}{\omega^2 C_{mnp}^2 Z_{rec}^2 + \left(1 + \frac{C_{mnp}}{C_{mns}}\right)^2}$$

$$X_m = -\frac{\omega}{C_{mnp}} * \frac{Z_{rec}^2 + \frac{C_{mnp}+C_{mns}}{\omega^2 C_{mns}^2 C_{mnp}}}{\omega^2 Z_{rec}^2 + \left(\frac{1}{C_{mnp}}+\frac{1}{C_{mns}}\right)^2}$$

Where $Z_m$ and $Z_{rec}$ are the total impedance in this direction;

Therefore, $Z_m = R_m + jXm$, $Z_{rec} = R_{rec} + jX_{rec}$;

$Z_m = R_m + jX_m, Z_{ReC} = R_{rec} + jX_{rec}$;

And, $C_{mnp}$=CNFC_6.78 MHZ/2, $C_{mns}$=CnotCh¬_6.78 MHZ/2, ω=2π×6.78×1000000

$C_{mnp}$=CNFC_6.78 MHZ/2, $C_{mns}$=CnotCh¬_6.78 MHZ/2, ω=2π×6.78×1000000

The current provided by the wireless signal transmission unit 1 is LRX, the first resonance unit 21 and the second resonance unit 22 are CRX, the CNFC_6.78 MHZ is the capacitance in the Near-Field Communication (NFC) module 9, $C_{NFC\_6.78\ MHZ}$ is the first notch filter resonance unit 31 and the second notch filter resonance unit 41, and RL is load elements 8.

In addition, because $R_m < R_{rec}$, the impedance coupled to the emitter end will increase, so as to increase the coupling efficiency.

And, the high-frequency wireless charging (Class-E rectifier circuit) itself will generate the second harmonic. The first notch filter module 3 and the second notch filter module 4 can block the second harmonics to not return to the Near-Field Communication (NFC) module 9, so as to achieve the protection for the Near-Field Communication (NFC) module 9.

As described above, the first notch filter module 3 and the second notch filter module 4 can block the signal of the Near-Field Communication (NFC) module 9 from being transmitted to the third resonance unit 23 and the fourth resonance unit 24, such that the signal will be transmitted to the Near Field Communication Module 9 (NFC). Therefore, the wireless signal transmission unit 1 (antenna coil) can be shared by the Near-Field Communication (NFC) module 9 and the high-frequency wireless charging (Class-E rectifier circuit) to achieve a space-saving effect, and the first notch filter module 3 and the second notch filter module 4 can enhance the ability to resist the electromagnetic interference.

We claim:

1. A sharing system of the near-field communication and the high-frequency wireless charging coils, which mainly comprises:
    a wireless signal transmission unit which both ends respectively has a first resonance unit and a second resonance unit;
    a first notch filter module located at one side of the first resonance unit facing away from the wireless signal transmission unit and connected in series with the first resonance unit; wherein the first notch filter module comprises a first notch filter resonance unit connected in series with the first resonance unit and a first notch filter impedance unit connected in parallel with the first notch filter resonance unit;
    a first rectifier module located at one side of the first notch filter module facing away from the first resonance unit and connected in series with the first notch filter module;
    a third resonance unit connected in parallel with the first rectifier module;
    a second notch filter module located at one side of the second resonance unit facing away from the wireless signal transmission unit and connected in series with the second resonance unit; wherein the second notch filter module comprises a second notch filter resonance unit connected in series with the second resonance unit and a second notch filter impedance unit connected in parallel with the second notch filter resonance unit;
    a second rectifier module located at one side of the second notch filter module facing away from the second resonance unit and connected in series with the second notch filter module;
    a fourth resonance unit connected in parallel with the second rectifier module;
    a voltage regulation module respectively connected with the first rectifier module and the second rectifier module;
    a load element connected in parallel with the voltage regulation module;
    a grounding portion set in one side of the load element;
    a shunt module connected with the output end of the voltage regulation module; wherein the shunt module comprises a first shunt portion connected with the first notch filter module and the first rectifier module and a second shunt portion connected with the second notch filter module and the second rectifier module; and
    a Near-Field Communication (NFC) module having a first connection end and a second connection end; wherein the first connection end is connected with the first notch filter module and the first resonance unit, and the second connection end is connected with the second notch filter module and the second resonance unit.

2. The sharing system of the near-field communication and the high-frequency wireless charging coils according to claim 1, wherein the voltage regulation module comprises at least one voltage stabilizing capacitance.

3. The sharing system of the near-field communication and the high-frequency wireless charging coils according to claim 1, wherein the load element comprises at least one resistance element.

4. The sharing system of the near-field communication and the high-frequency wireless charging coils according to claim 1, wherein the first resonance unit, the second resonance unit, the third resonance unit, and the fourth resonance unit are capacitance.

5. The sharing system of the near-field communication and the high-frequency wireless charging coils according to claim 1, wherein the first shunt portion and the second shunt portion are inductance.

6. The sharing system of the near-field communication and the high-frequency wireless charging coils according to claim 1, wherein the second notch filter resonance unit and the second notch filter resonance unit are capacitance.

7. The sharing system of the near-field communication and the high-frequency wireless charging coils according to claim 1, wherein the first notch filter impedance unit and the second notch filter impedance unit are inductance.

* * * * *